United States Patent [19]
Hopkins

[11] Patent Number: 5,808,415
[45] Date of Patent: Sep. 15, 1998

[54] APPARATUS FOR SENSING RF CURRENT DELIVERED TO A PLASMA WITH TWO INDUCTIVE LOOPS

[75] Inventor: Michael Hopkins, Raheny, Ireland

[73] Assignee: Scientific Systems Research Limited, Ireland

[21] Appl. No.: 820,914

[22] Filed: Mar. 19, 1997

[51] Int. Cl.$^6$ .................................................. G01R 27/16
[52] U.S. Cl. ...................................... 315/111.21; 324/95
[58] Field of Search ....................... 315/111–21; 324/95; 333/24 R

[56] References Cited

U.S. PATENT DOCUMENTS

| | | | |
|---|---|---|---|
| 5,041,791 | 8/1991 | Ackerman et al. | 324/318 |
| 5,325,019 | 6/1994 | Miller et al. | 315/111.21 |
| 5,565,737 | 10/1996 | Keane | 315/111.21 |

OTHER PUBLICATIONS

Kester, W., "High–Speed Design Seminar", Analog Devices, 2nd ed., pp. I–55 to I–69, Apr. 1990.

Kester, W., "Mixed–Signal Design Seminar", Analog Devices, pp. III–2 to III–11, Mar. 1991.

Primary Examiner—Robert J. Pascal
Assistant Examiner—Justin P. Bettendorf
Attorney, Agent, or Firm—Thomas M. Freiburger

[57] ABSTRACT

An apparatus for sensing RF current delivered to a plasma includes an RF conductor along which the current is delivered to the plasma and which is divided into two parts along part of its length so that substantially equal currents flow in each part. A sensor device is inserted into the gap between the two parts of the conductor and includes first and second inductive loops disposed one on each side of the gap such that when an RF current flows along the RF conductor the magnetic flux surrounding the conductor which is generated by the RF current couples with the loops respectively in opposite directions relative to the sensor device. If a stray magnetic flux normal to the current direction couples with the loops in the same direction relative to the sensor device it will induce voltages in the loops which respectively add to the voltage induced by the RF current in one loop and subtract from the voltage induced by the RF current in the other loop. Thus by adding the voltages induced in the loops, for example by connecting them in series, the voltages induced by the stray magnetic flux tend to cancel.

10 Claims, 8 Drawing Sheets

APPARATUS FOR SENSING RF CURRENT DELIVERED TO A PLASMA WITH TWO INDUCTIVE LOOPS

BACKGROUND OF THE INVENTION

This invention relates to apparatus for sensing RF current delivered to a plasma in a plasma chamber, for example a process reactor. The invention also relates to a waveform sampling circuit for use, inter alia, with such apparatus.

By accurately measuring the current-voltage characteristic of the power delivered to the plasma in a process reactor, the plasma can be monitored to give useful information on the plasma process (for example, etching or deposition) and allow better control of that process.

In order to characterise the plasma the current and voltage waveforms inside the chamber at the surfaces in contact with the plasma are required. Because of the intrinsic impedance of the chamber itself, the current and voltage waveforms at the point outside the chamber where the sensor is located are different from those at the electrode surface or antenna. More importantly, the chamber impedance affects each frequency component of the current and voltage waveforms differently. However, the values of the chamber impedances (Z) can be established by the application of a harmonic rich signal with a fundamental of 13.56 MHz (or other normal operating frequency) to a chamber without creating a discharge. At each harmonic the equation $Z(w)=V(w)/I(w)$ is obeyed, where $V(w)$ is the complex voltage and $I(w)$ is the complex current at the angular frequency w.

If the plasma chamber impedance network is represented by four unknown values, chamber resistance, electrode inductance, electrode-to-ground capacitance and stray capacitance, as shown in FIG. 1, then the values of the impedance of the chamber at each of the first five harmonics $Z(w1)$, $Z(w2)$, $Z(w3)$, $Z(w4)$ and $Z(w5)$ can be used in a non-linear search algorithm to establish the most likely values of the impedance of the network in the absence of a plasma. Once the network impedance values are established then the current and voltage waveforms present at the electrode in the presence of a discharge can be obtained. Once these are known the true plasma impedance can be obtained. This technique allows the monitoring of the state of the plasma during normal operation but also requires a measure of the electrical state of the chamber in the absence of a discharge (the chamber network values). This provides a powerful plasma machine diagnostic as well as a diagnostic of the plasma within the machine.

In order to separate the current components flowing in the network from that flowing in the plasma and to obtain reliable values of the impedance of the chamber it is necessary to obtain very high resolution measurements of the current-voltage waveforms near the chamber. The relative phase between the current and voltage is also required to obtain the complex values of both waveforms.

In principle, voltage and current measurements are straightforward. In practice the main technical difficulties are due to inadequate shielding of the current and voltage sensors from stray fields. The most important aspect of pickup from stray fields is the effect on phase. For example, if the current is represented by $I=I_o \sin(wt)$ and the voltage $V=V_o \cos(wt)$, if the accuracy required in the measurement of the phase is to be less that 0.1 degrees then the cross-talk between current and voltage channel when the measured current and voltage signals are approximately equal must be less than −60 dB. If the output of the voltage channel greatly exceeds the current signal then the cross-talk criterion is even more severe. This shift in phase due to cross-talk is very important particularly in the calculation of real power delivered to a plasma. Similar problems can arise if stray magnetic flux cuts the current pick-up coil from out side the sensor head which has a different phase from the current being measured. Other causes of phase shift can in principle be removed by careful calibration but the problem of stray external fields cannot.

The standard approach to sensing the current and voltage signals is shown schematically in FIG. 2 which shows a conductor 10 along which RF current flows to a plasma chamber (not shown). The conductor 10 is surrounded by a grounded metal shield (Faraday shield) 12, only one side of which is shown in FIG. 2. The current and voltage signals are measured using a single loop 14 for the current sensing and a capacitor 16 for the voltage sensing. Each sensor 14, 16 is connected in series with a respective 50 ohm resistor 18 through a respective conventional BNC connector 20. The voltages $V_i$ and $V_v$ developed at the resistors 18 are given by:

$$V_i = MdI/dt \text{ and } V_v = RCdV/dt$$

where M is the mutual inductance between the loop 14 and the current path 10, C is the capacitance between the current path 10 and ground via the 50 Ohm resistor 18, and I and V are respectively the RF current and voltage flowing in the RF conductor 10.

Having obtained $V_i$ and $V_v$, a waveform sampling circuit is used to extract the amplitude and phase of their Fourier components, for example $f_1=13.56$ up to $f_5=67.8$ MHz. This is conventionally achieved by high speed sampling using a sample frequency $f_s => f_{ny}$ ($f_s$ equal to or greater than $f_{ny}$), where $f_{ny}$ is the Nyquist frequency which is equal to $2 \times f_a$, where $f_a$ is the analogue bandwidth. In the above example $f_a => 67.8$ MHz. However, the signal-to-noise ratio (SNR) is limited by low bit resolution of the high speed flash converters currently available to operate at this high conversion speed $f_s$. The equation for SNR is:

$$SNR = 6.02n + 1.6dB + 10\log_{10}(f_s/2f_a)$$

where n is the number of bits of the converter, and a typical SNR of 50 dB is possible. This approach is expensive due to the requirement to use high speed RAM to store the converted values at the high sampling speed fs. An improvement is achieved by aliasing to reduce the required sample rate to below 13.56 MHz, as described in U.S. Pat. No. 5,565,737 using 12 bit converters. As the analogue bandwidth is still very high the SNR is maintained at approximately 50 dB but cheaper components can be employed and the dynamic range is increased by use of the 12 bit converters.

A problem with the known apparatus shown in FIG. 2 for obtaining $V_i$ and $V_v$ is that the accuracy of the current measurement by the loop 14 is reduced by the presence of stray magnetic flux originating from sources outside the RF conductor.

Problems with the known waveform sampling techniques described above are the low value of SNR which makes the calculation of the true plasma current and voltage difficult, and the use of non-coherent sampling which means that the record time does not contain an exact integer number of cycles. Time weighting of the samples is therefore required to reduce frequency side lobes on the Fourier transform and large samples sets are required to obtain reasonable values of phase resolution. Also, the frequency of sampling is determined by the fundamental frequency of the signal to be measured, and the system cannot handle the wide range of frequencies that are currently being used to bias chucks and develop new diagnostics and sensors (100 kHz to 27 MHz).

OBJECTS AND SUMMARY OF THE INVENTION

It is therefore a first object of the invention to provide an improved apparatus for sensing RF current delivered to a plasma in which the problem caused by stray magnetic flux is eliminated or mitigated.

It is a second object of the invention to provide an improved waveform sampling circuit allowing the resolution of the sampling electronics to be significantly increased while maintaining a relatively low cost approach.

Accordingly, as regards the first object, the invention provides apparatus for sensing RF current delivered to a plasma, the apparatus including an RF conductor along which the current is delivered to the plasma and which is divided into two parts along part of its length so that substantially equal currents flow in each part, and a sensor device inserted into the gap between the two parts of the conductor and including first and second inductive loops disposed one on each side of the gap such that when an RF current flows along the RF conductor the magnetic flux surrounding the conductor which is generated by the RF current couples with the loops respectively in opposite directions relative to the sensor device, whereby a stray magnetic flux normal to the current direction which couples with the loops in the same direction relative to the sensor device will induce voltages in the loops which respectively add to the voltage induced by the RF current in one loop and subtract from the voltage induced by the RF current in the other loop.

Thus by adding the voltages induced in the loops, for example by connecting them in series, the voltages induced by the stray magnetic flux tend to cancel.

Further problems with the known sensing technique of FIG. 2 are inadequate shielding due to RF current flowing in the Faraday shield, strong electric fields near the current sensing loop causing the loop to sense voltage as well as current (cross-talk), and the physical separation between voltage sensing and current sensing points. These problems are eliminated or mitigated in the embodiment of the invention by providing the sensor head with a capacitor located in the gap in the RF conductor between the first and second loops and a Faraday shield in register with and on opposite sides of the first and second loops.

As regards the second object, the invention provides a waveform sampling circuit including means for sampling the waveform at a sampling frequency $f_s = f(M/N)$ where f is the fundamental frequency of the waveform and M and N are integers having no common factor.

It is to be understood that the waveform sampling circuit according to the invention is of general applicability, and can be used for sampling waveforms other than those produced by a sensor device inserted in an RF conductor of a plasma chamber.

DETAILED DESCRIPTION OF A PREFERRED EMBODIMENT

Figure 3:
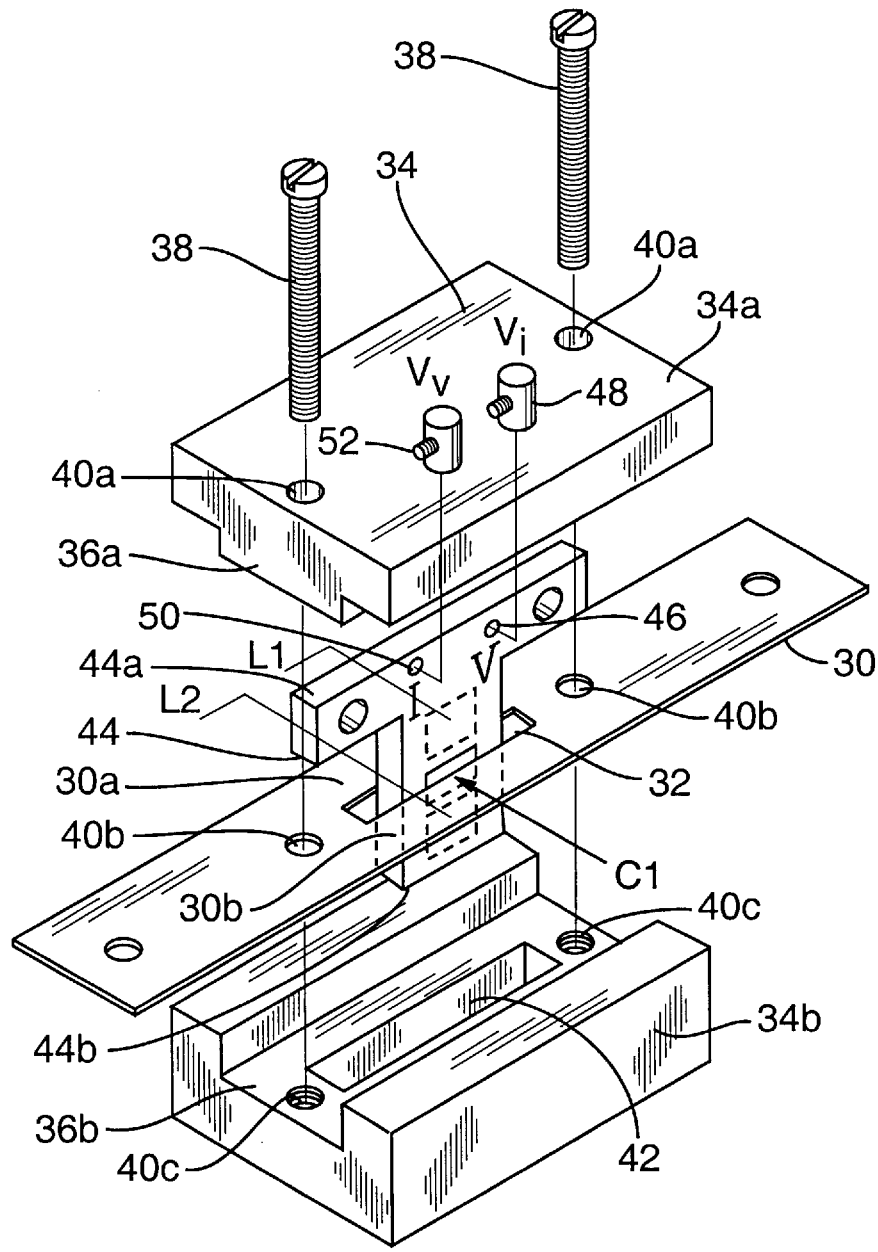
FIG. 3 is an exploded perspective view of a first embodiment of an apparatus according to the invention.

Referring to FIG. 3, apparatus according to the embodiment of the invention includes an RF conductor in the form of a flat conductive copper strip 30 along which RF current is delivered to a plasma in a plasma chamber (not shown). A slot 32 extends along the center of the conductive strip 30 in the direction of current flow. The slot 32 divides the conductive strip 30 longitudinally into two parts 30a, 30b of substantially equal width so that, in use, substantially equal currents flow in each part.

An insulating housing 34 includes upper and lower parts 34a, 34b respectively (in this description terms of orientation such as "upper", "lower", "horizontal" and "vertical" relate to the orientation of components as seen in the drawings, and do not imply any particular orientation in use). The lower part 34b of the housing 34 has a channel 36b of the same width as the conductive strip 30 for accommodating the conductive strip, and the upper part 34a has a projection 36a of complementary cross-section to the channel 36b.

The two housing parts 34a, 34b are clamped onto the conductive strip 30 by bolts 38, made of insulating material, which pass through aligned holes 40a, 40b and 40c in the upper housing part 34a, conductive strip 30 and lower housing part 34b respectively. Thus the conductive strip 30 is clamped between the base of the channel 36b and the lower surface of the projection 36a at a well-defined position relative to the housing 34. The lower housing part 34b has a slot 42 in the channel 36b which underlies the slot 32 in the conductive strip 30.

The housing 34 contains a T-shaped sensor head 44. The horizontal upper crossbar 44a of the sensor head 44 is mounted in the upper housing part 34a so that the vertical leg 44b of the sensor head extends down through the slot 32 in the conductive strip 30 and into the slot 42 in the channel 36b.

The leg 44b of the sensor head 44 has embedded therein first and second series-connected inductive loops L1 and L2 which, when the housing 34 is clamped on the conductive strip 30 as described, are located respectively above and below the slot 32 substantially symmetrically relative to the strip 30. The loops L1, L2 have the same area and, as will be described, are disposed in respective closely spaced planes parallel to the longitudinal axis of the conductive strip 30. Thus, when an RF current flows along the conductive strip 30, the magnetic flux surrounding the conductive strip 30 which is generated by the RF current couples with the loops L1 and L2 respectively in opposite directions relative to the sensor head 44. As will be described, in order to prevent or reduce capacitive pick-up by the loops L1 and L2, the latter are screened by grounded Faraday shields formed within the head 44. The shields do not cover the inside of the loops and are not complete to avoid generating eddy currents.

Figure 1:
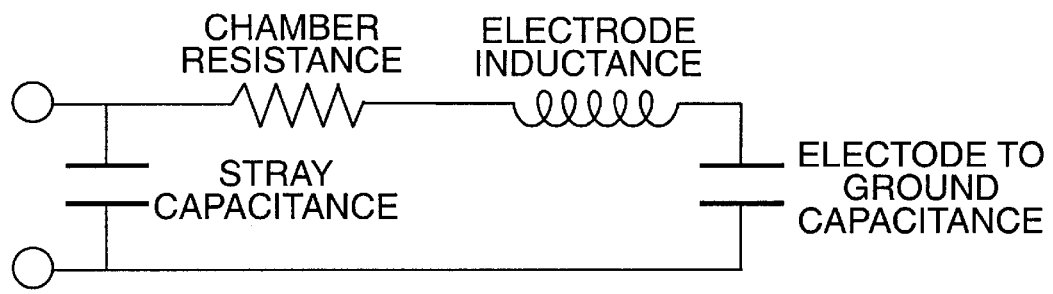
FIG. 1, previously described, represents a typical impedance network of a plasma chamber.
Figure 2:
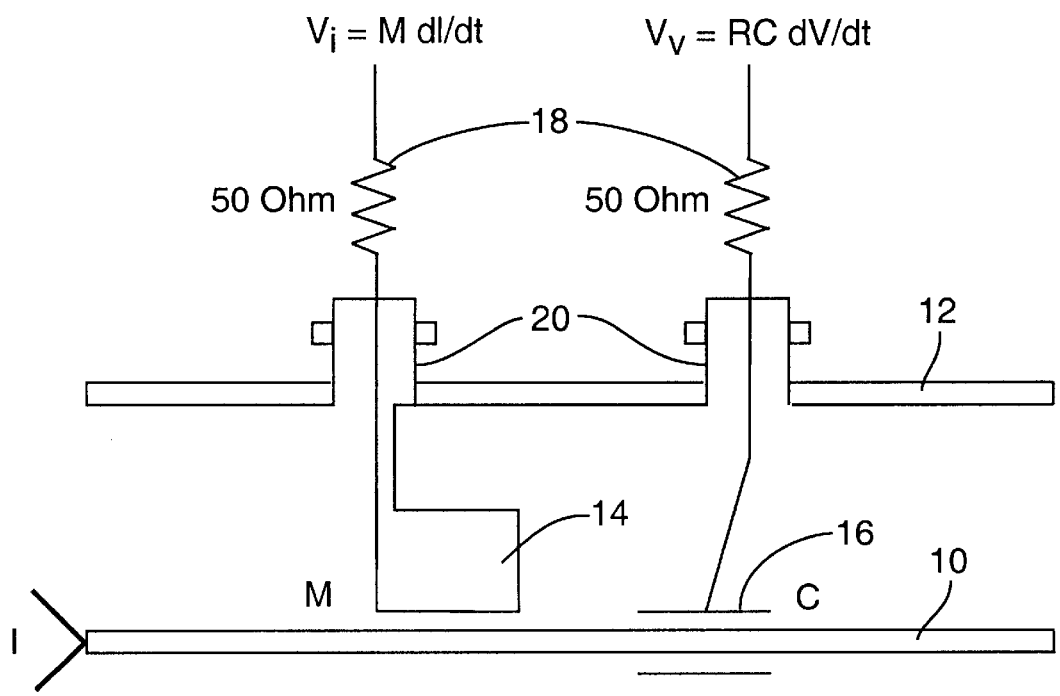
FIG. 2 shows a prior art technique for sensing RF current and voltage supplied to a plasma chamber.

Within the sensor head 44, the loops L1 and L2 are connected in series between one of the grounded Faraday shields and an output terminal 46. The latter is electrically connected in the housing part 34a to a standard BNC connector 48 via a 50 ohm resistor (not shown) to produce a voltage $V_i$ equivalent to that described with reference to FIG. 2. The voltage $V_i$ will be the sum of the individual voltages induced in the loops L1 and L2 by the flux generated by the RF current flowing in the conductive strip 30 and by any stray flux.

In the absence of stray magnetic flux, and assuming the loops are substantially identical in area and positioned symmetrically above and below the conductive strip 30, the output voltage $V_i$=V+V=2V, where V is the voltage induced in each loop by the current flowing in the conductive strip 30.

However, a stray magnetic flux normal to the current direction which couples with the loops L1, L2 in the same direction relative to the sensor head 44 will induce voltages in the loops L1, L2 which respectively add to the voltage induced by the RF current in one loop and subtract from the voltage induced by the RF current in the other loop. Therefore, the total induced voltage $V_i$ at the terminal 46 will in this case be $V_i$=(V+$V_s$)+(V−$V_s$)=2V, where $V_s$ is the voltage induced in each loop by the stray flux assuming the latter is uniform in the region of the head 44. Therefore, the voltages induced by the stray flux will cancel, or at least partially cancel if the stray flux is not uniform as assumed.

In order to measure RF voltage at the same location along the RF conductor as the RF current is measured by the loops L1 and L2, the sensor head 44 includes a parallel plate capacitor C1 between the loops L1 and L2. When the head 44 is assembled to the conductive strip 30 as described above, the capacitor is located in the slot 32 in the conductive strip 30. The capacitor C1 comprises two electrodes (one of which can be seen in FIG. 3) located on opposite outer surfaces of the head 44 each of which is soldered directly to the adjacent edge of the slot 32 to provide a rigid mechanical and electrical connection to the current carrying strip 30.

Current flows from the outer capacitor electrodes to an inner capacitor electrode, not seen in FIG. 3, embedded in the head 44. From the inner capacitor electrode the current flows via a further output terminal 50 on the head 44 and a further 50 ohm resistor (not shown) to a second BNC connector 52 on the upper housing part 34a. This provides a potential divider with the voltage $V_v$ on the 50 ohm resistor being related to the RF voltage on the current carrying strip 30 as described for FIG. 2. The voltages $V_i$ and $V_v$ provided at the BNC connectors 48 and 52 are fed to a waveform sampling circuit to be described later.

Figure 4:
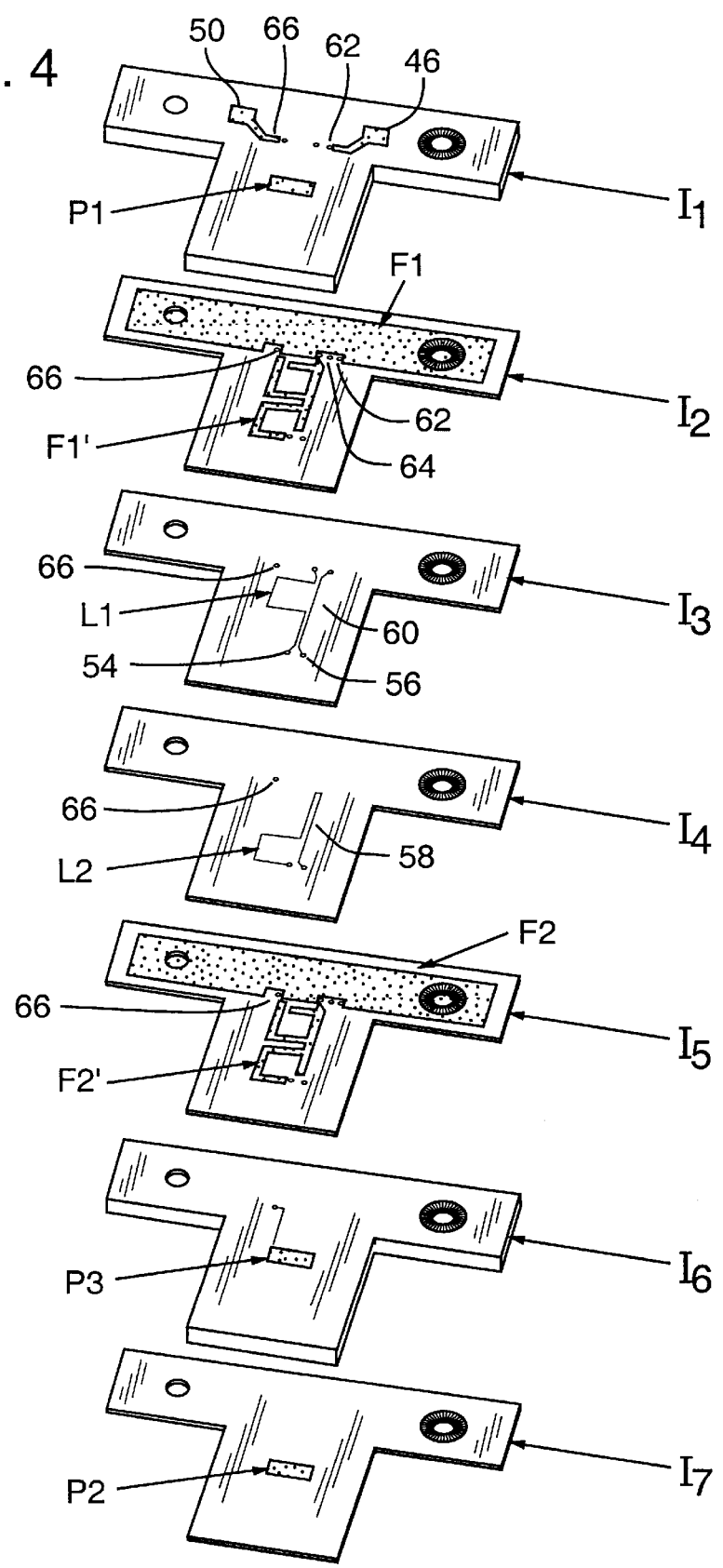
FIG. 4 is an exploded perspective view of the sensor head of FIG. 3 showing the various patterned layers making up the sensor head.
Figure 5:
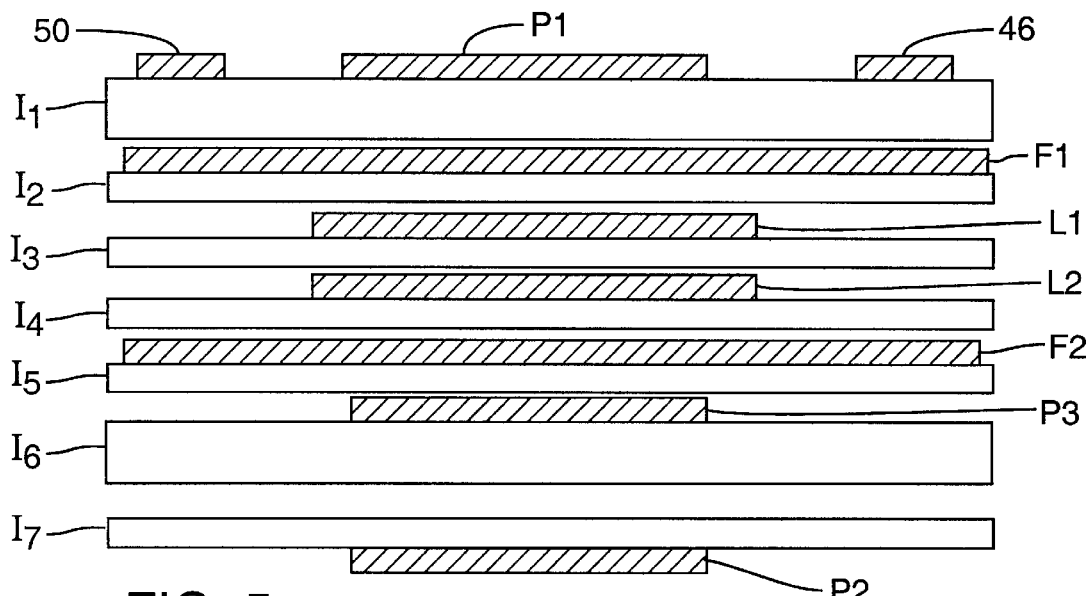
FIG. 5 is a schematic side view, not to scale, of the patterned layers shown in FIG. 4.

As seen in FIGS. 4 and 5, in this embodiment the sensor head 44 is manufactured as a laminar structure comprising seven T-shaped layers I1 to I7 of insulating material arranged parallel to the direction of current flow in the RF conductor 30 and each bearing a respective pattern of thin film conductive material. The conductive patterns, which are shown in black in FIG. 4 and hatched in FIG. 5, may be applied to the layers I1 to I7 by standard printed circuit manufacturing techniques.

Layers I1 and I6 are between 1 mm and 2 mm thick and made of PTFE. Layers I2 to I5 and I7 are 0.356 mm thick and made of epoxy glass fabric laminate. It will be appreciated that although FIG. 5 shows the layers I1 to I7 slightly apart from one another in order to show clearly upon which surface of each the respective conductive pattern is applied, in fact they are bonded together one directly upon the other to make a unitary head 44. The layers may be bonded together using epoxy resin.

Figure 6:
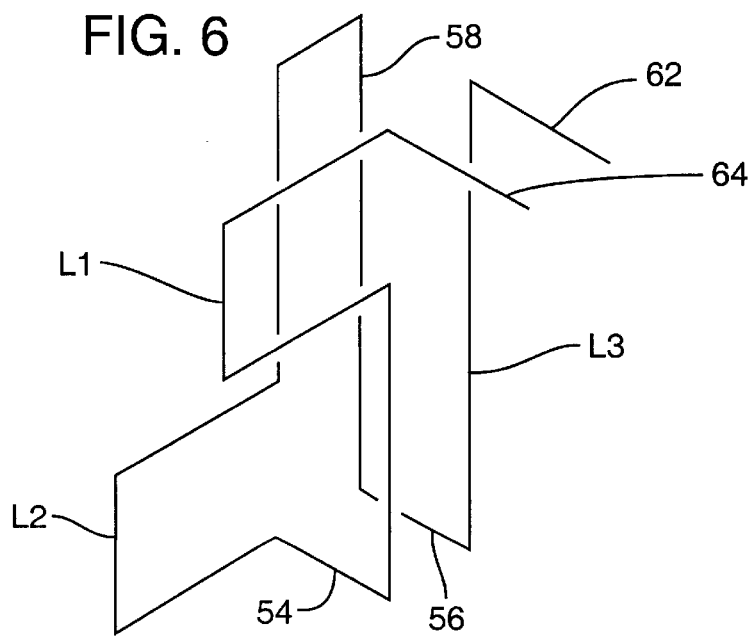
FIG. 6 is a schematic view, not to scale, showing how the inductive loops within the sensor head are made up from conductive patterns deposited on and extending through certain layers of the sensor head.

As seen in FIG. 4, the inductive loops L1 and L2 are formed as thin film conductive tracks on the layers I3 and I4 respectively, and conductive via holes 54, 56 in the insulating layer I3 connect the loops L1 and L2 in series as seen schematically in FIG. 6. It will be observed in FIG. 6 that a third inductive loop L3 is also formed, primarily by the vertical tracks 58 and 60, which is normal to and in series with the loops L1 and L2. Because the loops L1 and L2 are formed in parallel planes it is possible for stray magnetic flux parallel to the conductive strip 30 to induce a voltage in the double loop structure. The third loop L3 provides that the voltages induced in the loops L1, L2 and L3 in respect of stray magnetic flux parallel to the RF conductor will tend to cancel.

There is very little pick-up of stray magnetic flux in the direction parallel to the planes containing the loops L1 and L2 and perpendicular to the current flow direction, because the loop area in this direction is very small. However a fourth loop could be added to cancel the component of field in this direction.

The insulating layers I2 and I5 have conductive patterns F1 and F2 respectively which constitute the Faraday shields referred to above. These shields have respective patterned regions F1', F2' which are in register with and on opposite sides of the loops L1 and L2. However, the regions F1', F2' do not cover the inside of the loops and are not complete to avoid generating eddy currents. The Faraday shields F1 and F2 are grounded in the upper housing part 34a.

The output terminals 46 and 50 are formed on the exposed outer surface of the layer I1. One end of the series-connected loops L1, L2 and L3 is connected to the terminal 46 through aligned via holes 62 in the layers I1 and I2, and the other end of the loops is connected to the Faraday shield F1 through a via hole 64 in the layer I2.

The parallel plate capacitor C1 (FIG. 3) has outer electrodes P1 and P2 formed as conductive pads on the outer surfaces of the layers I1 and I2 respectively. As mentioned before, these pads are soldered directly to the opposite edges of the slot 32 in the conductive strip 30. An inner capacitor electrode is formed as a pad P3 on the layer I6, and is connected through aligned via holes 66 in the layers I1 to I5 to the output terminal 50 on the layer I1. All three pads P1, P2 and P3 are in register with one another on their respective layers I1, I7 and I6.

Figure 10:
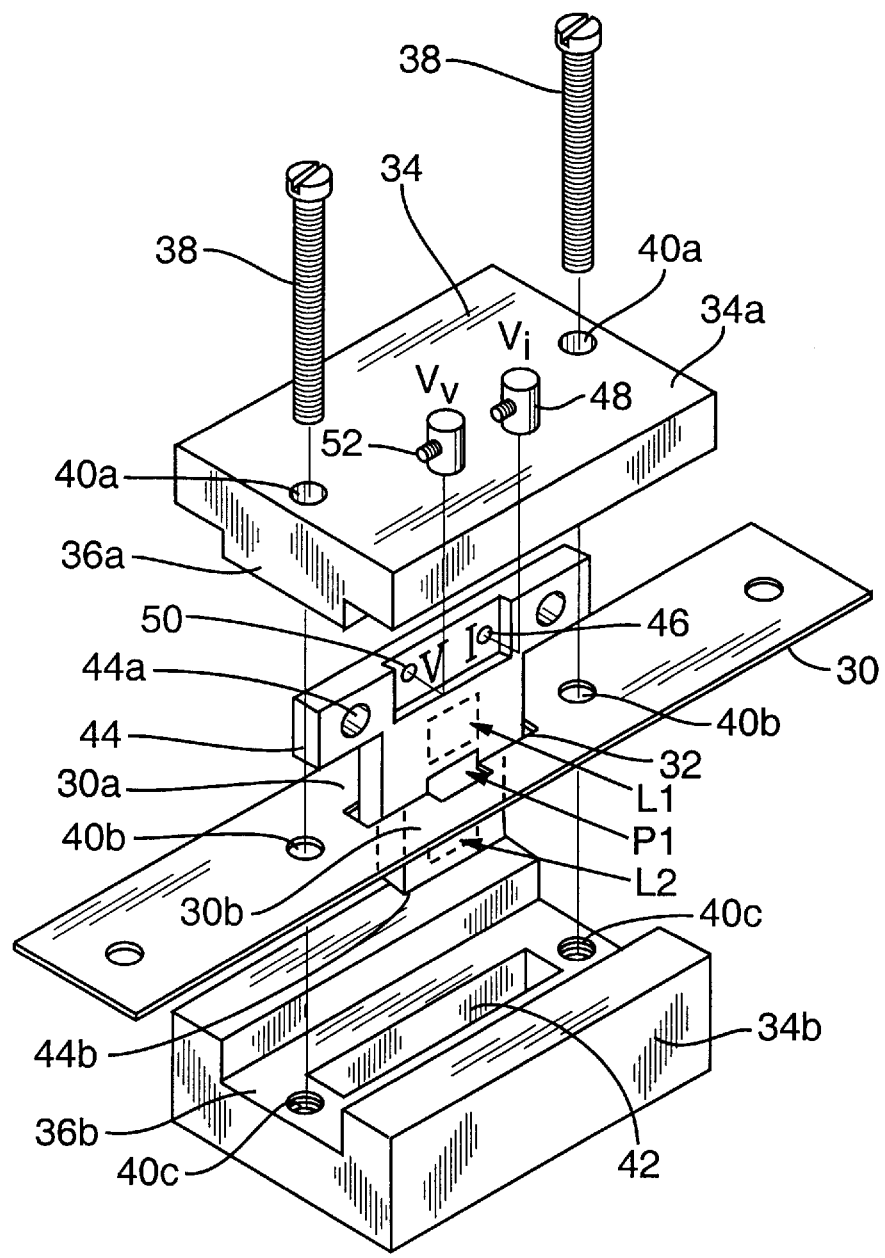
FIG. 10 is an exploded perspective view of a second embodiment of the apparatus according the invention.
Figure 11:
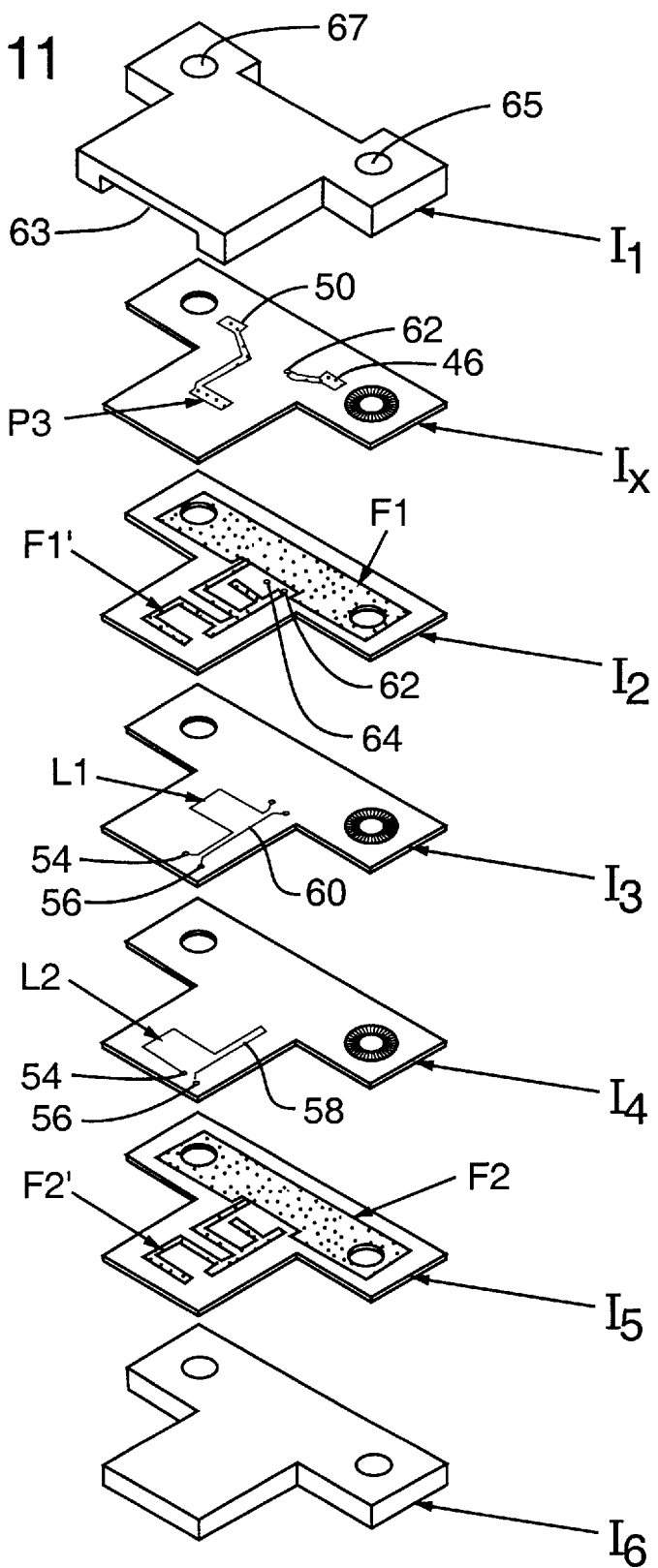
FIG. 11 is an exploded perspective view of the sensor head of FIG. 10 showing the various patterned layers making up the sensor head.

Variations of the sensor head 44 are possible. In a second embodiment of the invention, the capacitor pads P1 and P2 are formed separately from the sensor head as L-shaped sections. Each pad is bonded to a respective external surface of the sensor head when the head 44 is in situ within the RF conductor, (FIG. 10). In doing so, the layer I7 is eliminated and the layers I1, I6 no longer need to incorporate circuitry as shown in FIG. 11. Instead, the terminals 50 and 46 previously defined on layer I1 and the pad P3 previously formed on I6 are now defined on an extra flexible layer Ix located between layer I1 and I2, so that all circuitry within the sensor head 44 is now protected by the more durable outer layers I1 and I6.

In the second embodiment, the layer I1 is wider than the remaining layers and a channel 63 is formed in the layer into which the remaining layers sit. In the second embodiment, the layers are also mechanically retained together by bolts (not shown) which pass through the holes 65 and 67 formed in the sensor head 44.

Figure 8:
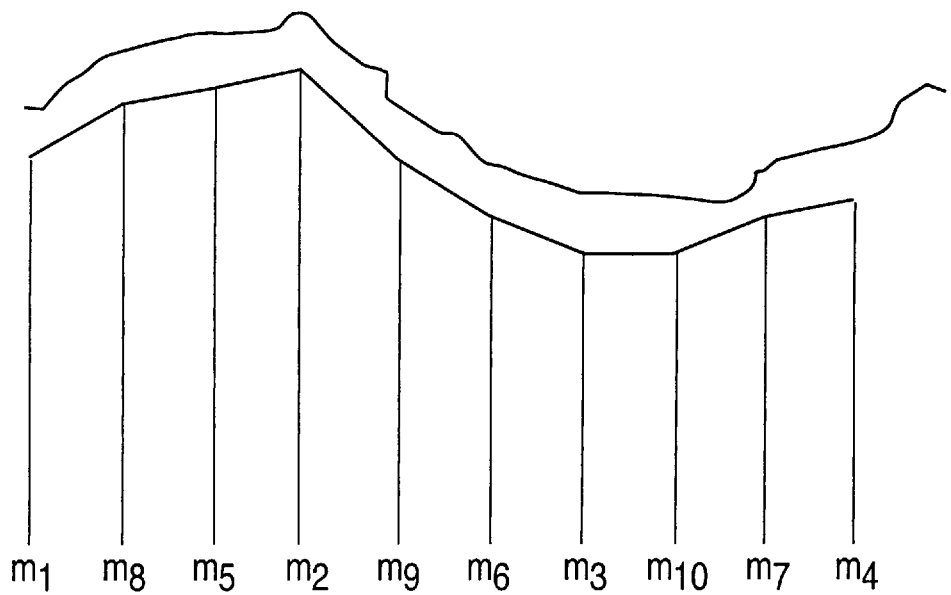
Figure 9:
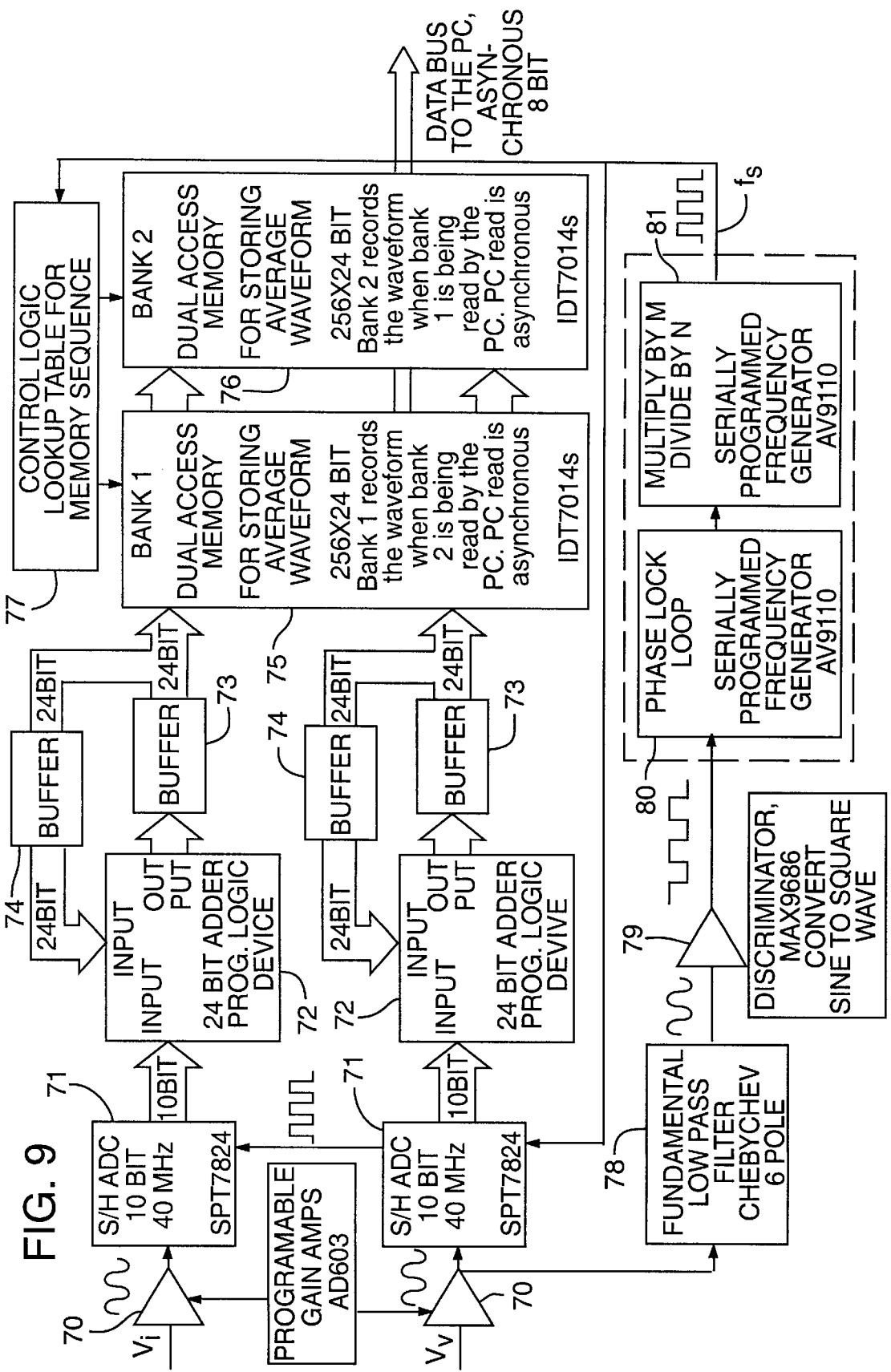
FIG. 9 is a block diagram of a waveform sampling circuit operating according to the principles of FIGS. 7 and 8.

The waveform sampling circuit shown in FIG. 9 is used to sample the waveforms of the $V_i$ and $V_v$ signals provided at the BNC terminals 48, 52 of the current and voltage sensing apparatus. This circuit uses a coherent sampling technique which eliminates the need for weighting in the Fourier transform functions and greatly increases the spectral resolution and phase detection capability. Prior to describing FIG. 9, however, the principles of operation of the circuit will first be described with reference to FIGS. 7 and 8.

In coherent sampling the sampling frequency $f_s$ is given by:

$$f_s = f(M/N)$$

where f is the fundamental frequency of the waveform being sampled and M and N are integers. This means the waveform will be sampled M times in each consecutive N whole number of cycles of the waveform.

Figure 7:
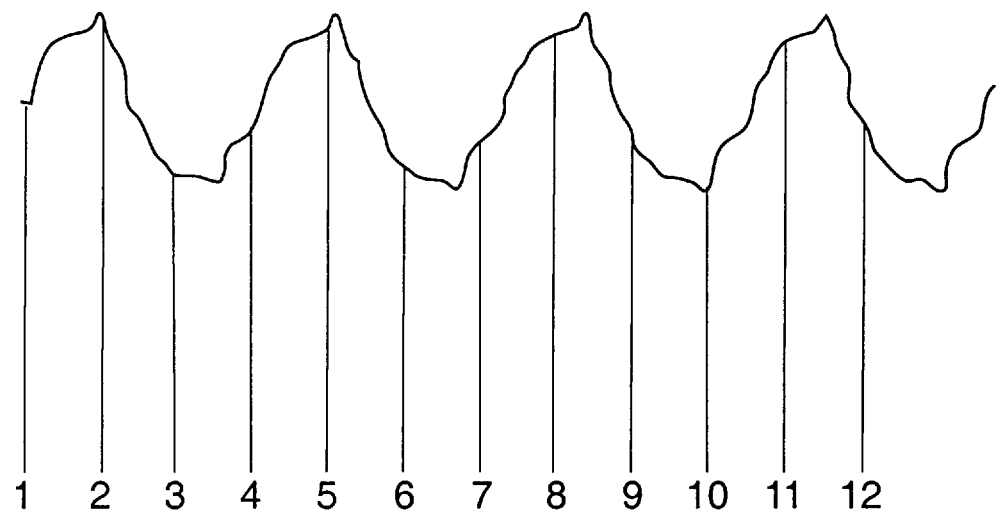
FIGS. 7 and 8 are waveform diagrams illustrating the principle of waveform sampling used in the embodiment of the invention.

If M and N have no common factor, all the samples during each N-cycle period (referred to herein as the record period) will be at a unique phase relative to the waveform. For example, FIG. 7 illustrates the case where f=2 Mhz, N=3 and M=10, so that $f_s$=f.10/3=6.67 Mhz. In FIG. 7:

Sample 1 records the waveform at phase 0 degrees.
Sample 2 records the waveform at phase 108 degrees.
Sample 3 records the waveform at phase 216 degrees.
Sample 4 records the waveform at phase 324 degrees.
Sample 5 records the waveform at phase 72 degrees.
Sample 6 records the waveform at phase 180 degrees.
Sample 7 records the waveform at phase 288 degrees.
Sample 8 records the waveform at phase 36 degrees.
Sample 9 records the waveform at phase 144 degrees.
Sample 10 records the waveform at phase 252 degrees.
Sample 11 records the waveform at phase 0 degrees.
Sample 12 records the waveform at phase 108 degrees.
In general, sample S records the waveform at phase $$rem_{360}[(S-1)*108]$$

where the expression $rem_x[Y]$ means the remainder when Y is divided by X.

Note that each sample advances 108 degrees along the waveform and that as M and N have no common factor then each sample is at a different phase until sample 11 (i.e. M+1), where the pattern is repeated for the next 3 (=N) cycle record period. The phase of the repeated pattern is identical to the first pattern so that if sample 11 is added to sample 1 and stored in a memory location $m_1$, then the average value of the waveform at phase 0 degrees equals the value in memory location $m_1$ divided by 2. Likewise, if sample 12 is added to sample 2 and stored in memory location $m_2$, then the average value of the waveform at phase 108 degrees equals the value in memory location $m_2$ divided by 2, and so on for sample 13 onwards.

In general there will be M memory locations $m_1, m_2 \ldots m_M$ and the Sth sample value is placed in memory location $m_Q$ where $Q=rem_M[S]$. This ensures that only samples taken at the same phase of the waveform are stored in the same memory location. The storage process can continue cumulatively for many thousands of record periods so that each of the memory locations $m_1$ to $m_M$ will contain the sum of many samples, although not in phase order. Then, the average value of the waveform at each sampled phase is given by the cumulative sum divided by Na, where Na is the integer value of the number of samples added to each memory location.

Returning to the particular embodiment shown in FIG. 7, as the sample frequency $f_s$ is 10/3 times the fundamental frequency f(=2 MHz) of the sampled waveform, then the waveform produced by sampling will contain the fundamental but the higher harmonics are corrupted by the effects of aliasing which reproduces the higher harmonics (4 mhz, 6 mhz, 8 mhz, 10 mhz, ...) within the Nyquist frequency band of 0 to 3.33 Mhz.

However, if the ten consecutive sample values of FIG. 7 are stored in non-consecutive memory locations such that consecutive memory locations contain the sample values in increasing rank by phase, the waveform is reproduced with an apparent sampling rate of 10 times the fundamental and the Nyquist limit is now $N.f_s/2$. This gives an effective Nyquist limit of 10 mhz. This is shown in FIG. 8, where $m_1$, $m_8$, $m_5$, $m_2$, $m_9$, $m_6$, $m_3$, $m_{10}$, $m_7$ and $m_4$ are consecutive memory locations in storage.

A major improvement associated with coherent sampling in the present embodiment is that the sampling frequency $f_s$ can be chosen with a great degree of freedom, to suit the operator, by suitable selection of N and M. To ensure accuracy the sampling frequency $f_s$ is preferably derived from the fundamental frequency f of the sampled waveform by frequency multiplication and division.

For example, if we wish to sample a waveform at 13.56 MHz or close to that frequency, we could chose the value of M=33 and N=67. The sample frequency would then be 6.67 MHz. Now 33 samples are captured in each record period of 67 cycles of the waveform, each sample being at a unique phase. The effective Nyquist frequency is fs/2*N, 446.9 MHz, well above the required analogue bandwidth of 67.8 MHz as discussed above. As the coherent sampling approach does not suffer windowing problems the 33 samples are sufficient to extract the first five harmonics to a degree of accuracy only limited by the SNR ratio of the converter. Fast Fourier techniques are not necessary as the number of samples is small and accurate integration (such as Runge-Kutta) can be used to obtain the Fourier sine and cosine integrals in a suitable programmed PC (personal computer) from which the amplitude and phase of the current and voltage signals can be obtained.

Assuming the analogue bandwidth is limited to 67.8 MHz, and using a sample frequency of 6.67 MHz, the SNR is approximately 50 dB for a 10 bit A/D converter and the total record sampling time required is only approximately 5 $\mu$s. Plasma measurements based on an IV probe such as sensor head 44 will require to be updated on time-scales of milliseconds to seconds. Therefore, the present rapid coherent sampling technique allows the opportunity to use averaging techniques to improve the SNR. This has the added advantage of maintaining a low memory storage requirement and allowing data to be quickly downloaded to the PC.

An embodiment of a circuit for sampling the Vi and Vv waveforms, based upon the above principles, will now be described with reference to FIG. 9. As the processing is essentially the same for both voltages Vi and Vv, only the processing of the voltage Vv will be described. In describing FIG. 9 it will be assumed that N=67, M=33 and Na (number of samples at the same phase stored cumulatively at each memory location)=64.

The voltage Vv is supplied through a programmable gain amplifier 70 to a respective sample/hold and analog to digital converter (ADC) 71. In the latter the Vv waveform is sampled and analog to digital converted at a rate determined by the sampling frequency fs. As will be described, the sampling frequency is derived from the fundamental frequency f of the Vv waveform. Each sampled value is output as a 10-bit word to one input of a 24-bit adder 72 having an output buffer 73 and an input buffer 74. In a first embodiment of the circuit, each buffer 73, 74 includes at least M words of memory, each word being wide enough to store the accumulated result of Na sample values added together. Thus, where Na is 64 and each sampled value is a 10-bit word, the buffers 73, 74 are preferably 24 bits wide.

The adder/buffer circuitry works as follows. At the beginning of a series of Na record periods the buffers 73 and 74 are cleared. A sample value is output by the ADC at a frequency fs. For each record period, a sample value is added to the contents of an address S in the input buffer 73 and the result is output and stored in a corresponding address S in the output buffer 74. The next sampled signal value is added to the next address S+1 in the input buffer 73 and accumulated result is stored in the corresponding address S+1 in the output buffer 74 and so on until the end of the record period.

For each sample value, the contents of the address S in the output buffer 74 are transferred to into a corresponding address S in the input buffer 73. At the beginning of the next record period, the address S for the input and output buffer is reset to 0, so that each sampled value Sn in a record period is added to a corresponding sampled value Sn in the previous record period.

For each sample value, the contents of the address in the output buffer 74 are also transferred into a corresponding address in one of two banks 75, 76 of dual access memory, determined by the contents of a look up table 77. In the present embodiment two banks of memory 75, 76 are employed. One bank is used to collect and store information being accumulated and the other bank is available to be read. The banks are switched when one is full. This allows the system to be continuously collecting data and maximises the SNR It will be seen that if access to the dual access memory 75, 76 were fast enough, the input and output buffer memories 73, 74 could be eliminated. In this case, the input to the adder 72 could be taken directly from the output of the dual access memory 75, 76 with the output of the adder being subsequently fed back to the same address in the dual access memory 75, 76.

There are a number of ways of organising the dual access memory 75, 76. In the first, sampled values for a record period stored in the output buffer 74 are transferred to a buffer of size M words in the dual access memory 75, 76. One buffer in dual access memory 75 or 76 is overwritten every second record period so that, in this case, only the accumulated values for the current record period are stored in memory.

Alternatively, the dual access memory 75, 76 can be divided in a series of buffers each of size M words. Accumulated sample values from one record period to another are stored in respective buffers in the dual access memory 75, 76, so that not only are the accumulated sample values for the current record period stored, but the difference between accumulated sample values for any record period A and the accumulated sample values for a previous record period A-1 gives the actual sample values for the record period A.

It will be seen that the differences in sample values from one record period to another are not of much interest. It will also be seen, however, that it is possible to store the accumulated signal values for several sets of record periods in respective contiguous buffers in the dual access memory. In the present embodiment the dual access memory comprises 256 words. In the present example, each buffer includes a set of 33 samples averaged over 64 record periods. Thus, seven buffers (7*33=231<256) containing the results of 7 separate sets of accumulated record periods each storing the accumulated values of 64 record periods, can be stored in dual access memory.

Averaging these accumulated values at the PC provides a signal having an improved SNR, which is calculated using the equation:

$$SNR_{Na} = 50 + 20*Log(Sqr(Na))$$

so that with Na=64 averages, $SNR_{64}$=68 dB. This represents a similar SNR to a 12 bit converter operating at the full Nyquist frequency of 135.6 MHz. By increasing the number of averages to 64*256, the time taken to read the required samples is 0.6 seconds and the SNR improves to $SNR_{64*256}$=92 dB As the time scales on which changes in the plasma processing environment which is of interest to the processing industry is in the order of a second, at the current time, the prototype has the option to have the averaging in the range Na=64 to 16384, giving a SNR in the range 68–92 dB with a 10 bit converter. This represents a dramatic improvement on the SNR possible with the present state of the art.

In the present embodiment, the sample values are stored in the order which they are received in the output buffer 74. It is necessary to reorganize the samples into phase order to build up a correct image of the signal. Reorganisation of the sample values could be achieved in software in the PC, but in the present embodiment, the look-up table 77 is used to direct sampled values into a phase order sequence in dual access memory. The contents of each word $C_s$ of the look-up table 77 corresponds to the offset address in the buffers within the dual access memory 75, 76 in which the Sth sample value is stored. The look-up table is updated by the PC if N or M are changed. An algorithm generates an array phi containing the phases of each sample S in a record period using the formula phi(S)=$rem_{360}$[(S-1)*360*N/M]. The contents of the array phi are then substituted for their relative phase order. Thus using the example, where M=10 and N=3, the contents of phi will be 1, 8, 5, 2, 9, 6, 3, 10, 7, 4. The array phi is then written to the look-up table 77 which then vectors each sampled value to the appropriate offset address in dual access memory 75, 76.

The frequency fs at which the signal Vv and Vi is sampled is locked to the fundamental frequency of the waveform. In the present embodiment, this is achieved by filtering the signal Vv through a low pass filter 78. The cut-off frequency of the filter 78 in the current embodiment is chosen as 15 Mhz so that the harmonics of fundamental frequencies between 7.5 and 15 Mhz are removed. The filtered signal is fed through a discriminator 79, in this case a MAX9686 produced by Maxim Integrated Products, to produce a digital pulse train. The pulse train is fed through a phase locked loop 80, in this case an AV9110 produced by Integrated Circuits Systems, Inc, to filter any noisy frequency variations in the digital pulse train. The phase locked signal is fed through a serially programmed frequency generator 81, again an AV9110, which is programmed by the PC to multiply the frequency of the phase locked signal by M and divide its frequency by N. This provides an output clock at a frequency fs which is guaranteed to enable Vi and Vv to be sampled coherently, regardless of variations in the fundamental frequency. The signal fs is then fed to the ADC's 71 providing a sampling clock and to the look-up table 77 to step through its contents and vector the sampled values into dual access memory correctly.

It will be seen that in the present embodiment, the fundamental frequency of the waveform Vi and Vv is not known. This can be easily determined by connecting a counter to the output of the phase locked loop 80 to count the number of cycles in a pre-determined time period and thus provide an indication of the fundamental frequency.

The foregoing has described the use of a synchronous, phase locked sampling system for the measurement of the RF current and voltage in a plasma environment in order to monitor, diagnose or control the plasma or plasma process. The advantage of the system is the ability to chose the sampling frequency over a wide range of frequencies and still measure accurate values of amplitude and phase. The system also permits the use of a small number of memory location to store the results. The synchronous nature allows averaging the signals to obtain very large values of SNR in a relative inexpensive design. Synchronous detection allows accurate Fourier components to be established with out leakage and the need for windowing functions.

It is noted that the resistor 18 generates a phase shift in the Vv signal, and this is rectified by the PC during the processing of the sampled values.

Modifications of the embodiment described above are possible within the scope of the appended claims. For example, the sensor head does not need to be manufactured as a laminate, nor the inductive loops by printed circuit techniques. Further, the inductive loops L1 and L2 need not consist of only a single turn each as shown, but could be multi-turn coils. Also, the loops L1 and L2 do not need to be connected in series. For example, if their outputs were taken individually to suitable processing circuitry the addition of the individual induced voltages $(V+V_s)$ and $(V-V_s)$ could take place there.

Further while it is advantageous that the loops L1 and L2 have substantially the same number of ampere-turns and substantially parallel axes normal to the direction of current flow in the RF conductor (as do the loops L1 and L2 in the preferred embodiment), this again is not strictly necessary as any imbalance or departure from symmetry in the loops could be compensated, at least to an extent, in suitably designed processing circuitry. In this connection the axis of a loop is that direction relative to the loop which, when orientated parallel to the magnetic field lines of a fluctuating magnetic field passing through the loop, would provide the maximum induced voltage in the loop for that magnetic field.

It will also be seen that in the second embodiment of the invention, the layers I1 and I6 can be integrally formed and thus provide enhanced protection from voltage breakdown.

I claim:

1. Apparatus for sensing RF current delivered to a plasma, the apparatus including an RF conductor along which the current is delivered to the plasma and which is divided into two parts along part of its length so that substantially equal currents flow in each part, and a sensor device inserted into a gap between the two parts of the conductor and including first and second inductive loops disposed one on each side of the gap such that when the RF current flows along the RF conductor the magnetic flux surrounding the conductor which is generated by the RF current couples with the loops respectively in opposite directions relative to the sensor device, whereby a stray magnetic flux normal to the current direction which couples with the loops in the same direction relative to the sensor device will induce voltages in the loops which respectively add to the voltage induced by the RF current in one loop and subtract from the voltage induced by the RF current in the other loop.

2. Apparatus as claimed in claim 1, wherein the first and second loops have substantially the same number of ampere-turns, substantially parallel axes normal to the direction of current flow in the RF conductor, and are connected in series, whereby the voltages induced in the loops by magnetic flux generated by current flow along the RF conductor will add but the voltages induced in the loops in respect of stray magnetic flux which couples with the loops in the same direction relative to the sensor device will tend to cancel.

3. Apparatus as claimed in claim 2, wherein each of the first and second loops comprises a pattern of conductive material formed on a layer of insulating material.

4. Apparatus as claimed in claim 3, wherein the sensor device comprises a laminar structure of a plurality of layers of insulating material disposed substantially parallel to the direction of current flow in the RF conductor, each of the first and second loops comprising a pattern of conductive material formed on a respective one of the insulating layers whereby the loops are disposed in respective substantially parallel spaced apart planes.

5. Apparatus as claimed in claim 4, wherein the sensor device includes a third inductive loop substantially normal to and connected in series with the first and second loops such that the voltages induced in the first, second and third loops in respect of stray magnetic flux parallel to the RF conductor will tend to cancel.

6. Apparatus as claimed in claim 4, wherein the sensor device further includes a capacitor having opposite spaced electrodes formed by respective regions of conductive material in register with one another on respective ones of the insulating layers.

7. Apparatus as claimed in claim 6, wherein the capacitor is located in the gap in the RF conductor between the first and second loops.

8. Apparatus as claimed in claim 6, wherein one of the electrodes of the capacitor is formed on the outer surface of one of the outer insulating layers and is rigidly mechanically and electrically fixed to an edge of the gap in the RF conductor.

9. Apparatus as claimed in claim 4, wherein the sensor device further includes a Faraday shield comprising respective regions of conductive material, formed on respective ones of the insulating layers, in register with and on opposite sides of the first and second loops.

10. Apparatus as claimed in claim 1, wherein the RF conductor is a flat conductive strip and is divided by forming a slot in the center of the strip extending in the direction of current flow, the sensor device being inserted in the slot.

* * * * *